(12) United States Patent
Rivet et al.

(10) Patent No.: US 8,059,760 B2
(45) Date of Patent: Nov. 15, 2011

(54) METHOD AND DEVICE FOR THE ANALOG PROCESSING OF A RADIO SIGNAL FOR A RADIO FREQUENCY RECEIVER

(75) Inventors: Francois Rivet, Bordeaux (FR); Didier Belot, Rives (FR); Yann Deval, Bordeaux (FR); Jean-Baptiste Begueret, Bordeaux (FR); Herve Lapuyade, Pessac (FR); Thierry Taris, Bordeaux (FR)

(73) Assignees: STMicroelectronics S.A., Montrouge (FR); Centre National de la Recherche Scientifique, Paris (FR)

( * ) Notice: Subject to any disclaimer, the term of this patent is extended or adjusted under 35 U.S.C. 154(b) by 769 days.

(21) Appl. No.: 12/130,538

(22) Filed: May 30, 2008

(65) Prior Publication Data

US 2008/0299936 A1    Dec. 4, 2008

(30) Foreign Application Priority Data

Jun. 4, 2007    (FR) ...................................... 07 55443

(51) Int. Cl.
*H04L 27/26*    (2006.01)
*H04K 3/00*    (2006.01)

(52) U.S. Cl. ......................... 375/340; 341/122; 341/155
(58) Field of Classification Search .................. 375/340; 341/122, 155, 159, 162, 163
See application file for complete search history.

(56) References Cited

U.S. PATENT DOCUMENTS

| | | | |
|---|---|---|---|
| 5,917,440 A | 6/1999 | Khoury | |
| 6,538,588 B1 | 3/2003 | Bazarjani | |
| 2002/0182762 A1* | 12/2002 | Powell | ........................... 438/22 |
| 2006/0103764 A1 | 5/2006 | Matsui et al. | |
| 2006/0232760 A1* | 10/2006 | Asbrock et al. | .............. 356/4.03 |

OTHER PUBLICATIONS

Staszewski et al, All-Digital TX Frequency Synthesizer and Discrete-Time Receiver for Bluetooth Radio in 130-nm CMOS, IEEE, vol. 39, Dec. 2004, p. 2284-2287.*
French Search Report, FA 696821, Feb. 5, 2008, 2 Pages.

* cited by examiner

*Primary Examiner* — Lee Nguyen
(74) *Attorney, Agent, or Firm* — Gardere Wynne Sewell LLP

(57) ABSTRACT

A device processes a received radio signal. Circuitry formulates voltage samples of the radio signal. Analog processing of those samples is performed. Then, digital processing is performed on the output of the analog processing. The circuitry for formulating voltage samples is configured to ensure a processing of the samples prior to the digital processing.

24 Claims, 4 Drawing Sheets

METHOD AND DEVICE FOR THE ANALOG PROCESSING OF A RADIO SIGNAL FOR A RADIO FREQUENCY RECEIVER

PRIORITY CLAIM

The present application is a translation of and claims priority from French Application for Patent No. 07 55443 of the same title filed Jun. 4, 2007, the disclosure of which is hereby incorporated by reference.

BACKGROUND OF THE INVENTION

1. Technical Field of the Invention

The present invention relates to the field of signal processing, and pertains in particular to a preprocessing performed at the input of a digital device.

The invention pertains more particularly to the processing of radiofrequency signals implemented in a digital processing device for signals such as a device known by the term of art as a "software radio".

2. Description of Related Art

A software radio is a device for processing a radiofrequency signal of purely digital nature.

The realization of such a device makes it necessary to process a bandwidth at least equal to twice the clock frequency. To process the incoming signal in real time and in a synchronous manner, the clock frequency to be considered is in relationship with the frequency of the radiofrequency domain, i.e. generally 2 GHz. The bandwidth of the signal digital processing device must therefore be equal to at least 10 GHz.

Additionally, the power gap of the signal arriving at a radiofrequency antenna may lie between a minimum of −100 dbm and a maximum of −20 dbm. The amplitude of the signal received may therefore be of the order of 100 db. It is then necessary to use a sampling with at least 16 bits to digitize signals of such an amplitude.

The constraints applying to the bandwidth and to the amplitude of the signal require considerable calculation power. The power consumption of calculation devices capable of carrying out such calculations is conventionally of the order of 500 to 1000 watts. Such power consumption is incompatible with the portability requirements of a software radio.

It is therefore desirable to decrease the complexity of the calculations to be carried out for processing signals arising from a radiofrequency antenna.

It is also necessary to decrease, in the same manner, the power consumption of the calculation means implemented for processing the radiofrequency signals.

Applicants further reference and incorporate by reference herein French Application for Patent No. 07 55441 entitled "Method and Electronic Device for Frequency Shifting an Analog Signal, in Particular for Mobile Telephony" by Didier Belot, et al. filed Jun. 4, 2007 and filed as PCT/FR2008/50973 on Jun. 3, 2008 (also incorporated herein by reference).

SUMMARY OF THE INVENTION

In an embodiment, a device for processing a radio signal comprises circuitry for digital processing of the radio signal, circuitry for formulating voltage samples of the radio signal and analog processing circuitry that ensures processing of the samples prior to the digital processing.

The device can furthermore comprise switching circuitry for sampling the radio signal and charge storage circuitry, disposed at the output of the switching circuitry, for storing at least one sample.

The switching circuitry for formulating samples can comprise at least one unit for storing samples that is able to successively acquire on command and in the form of a charge successive samples of an analog input signal, to preserve the charge for a determined duration, and to release on command the charge, the charge being dependent on the amplitude of the analog input signal.

Several units for storing samples can be associated in series so as to store a number of samples equal to the number of storage units.

As a variant, several units for storing samples can be associated in parallel so as to store a number of samples equal to the number of storage units.

The units for storing samples can be inserted into a circuit loop so as to reuse each sample.

According to another embodiment, a method of processing a radio signal by digital processing of the signal, comprises, prior to the digital processing, voltage sampling the radio signal and carrying out an analog processing of the samples.

It is possible to acquire on command and in the form of a charge a sample of an analog input signal, preserve the charge for a determined duration, and release on command the charge.

The acquisition and the release of the charge can be carried out on command of a switching circuit.

It is further possible to control charge retention means in such a way as to perform elementary arithmetic operations between various stored samples.

BRIEF DESCRIPTION OF THE DRAWINGS

Other aims, characteristics and advantages of the invention will become apparent on reading the following description, given solely by way of non-limiting example and with reference to the appended drawings in which.

DETAILED DESCRIPTION OF THE DRAWINGS

Figure 1:
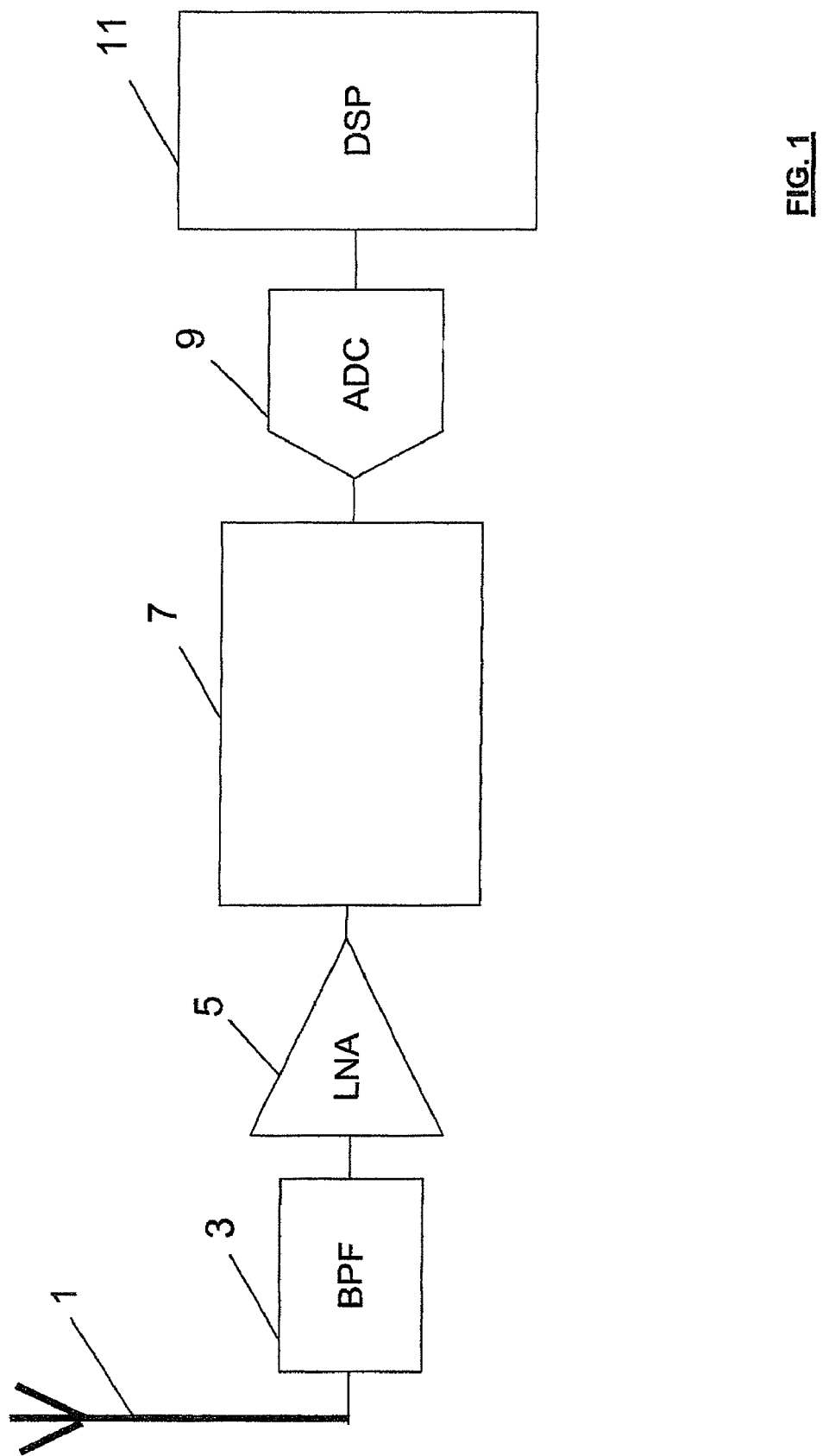
FIG. 1 illustrates a device for processing a radio signal.

Represented in FIG. 1 is an exemplary embodiment of a device for processing radiofrequency signals arising from a radiofrequency antenna. In a mode of implementation, such a device can be incorporated into a software radio.

As may be seen in FIG. 1, in the embodiment represented, the chain for acquiring and processing a radiofrequency signal successively comprises, considering the direction of processing of the signals: an antenna 1; a bandpass filter (BPF) 3; a low noise amplifier (LNA) 5; a first signal processing stage (SASP) 7; an analog-to-digital converter (ADC) 9 and a second signal processing stage 11.

While the first signal processing stage 7 is an analog processing device, the second processing stage 11 is a digital processing stage.

The first analog signal processing stage 7, disposed upstream, is designed to perform an analog preprocessing of the radio signal, prior to the digital processing carried out by the second digital signal processing stage 11, so as to relieve the second digital signal processing stage 11 and to minimize the quantity of digital calculations to be performed by the second digital signal processing stage 11, as well as the overall power consumption of the calculation circuitry implemented.

This acquisition and processing chain operates in the following manner.

The radiofrequency wave picked up by the antenna 1 is transformed, by the antenna 1, into an analog electrical signal. The signal is thereafter filtered by the bandpass filter 3 to separate the data signal from the carrier signal. The data signal, also called the radiofrequency signal, is thereafter amplified by the low-noise amplifier 5. The signal obtained is processed by the first radio signal processing stage 7. The effect of this processing is to decrease the quantity of operations to be carried out by the second signal digital processing stage 11. The analog-to-digital converter 9 ensures, for its part, the switch from a mode of analog processing of the data to a digital processing mode.

Figure 2:
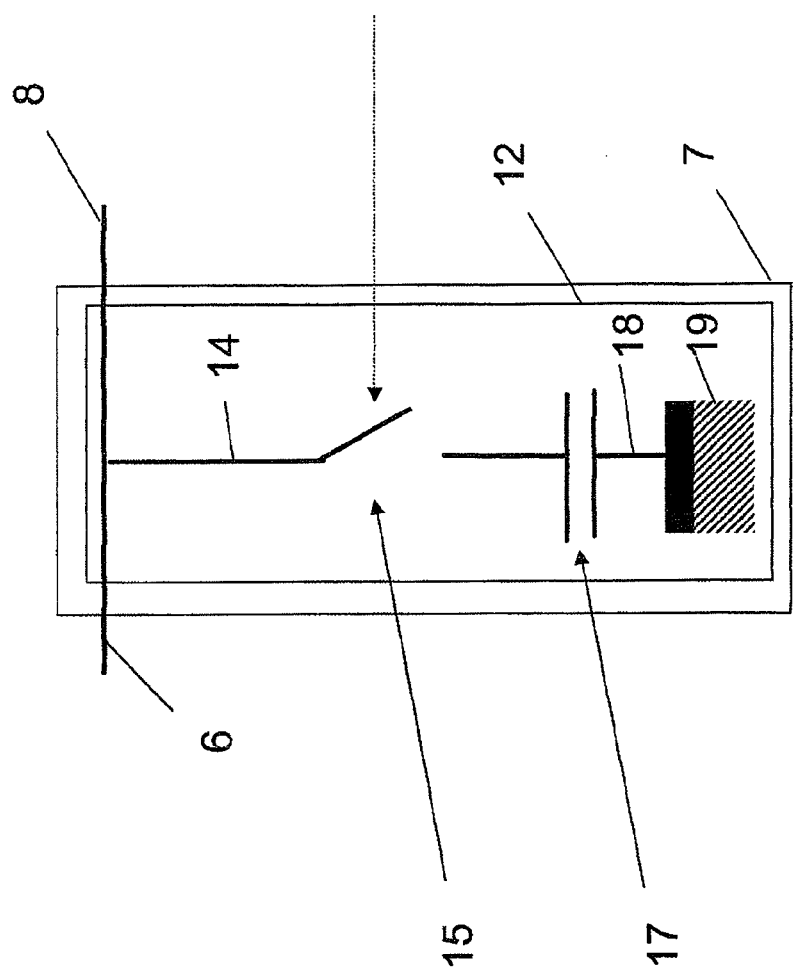
FIG. 2 shows the main elements of a circuit for formulating samples of the device of FIG. 1.

By referring to FIG. 2, the first processing stage 7 operates with analog signals.

Stage 7 comprises one or more storage units 12 for storing samples. A storage unit 12 for storing samples is represented in FIG. 2. It comprises an input 6 linked by a connection 14 to a controlled breaker (switch) 15. The controlled (switch) breaker 15 is linked to a charge storage means 17, which is itself linked to earth (ground) 19 by a connection 18. The input 6 is also linked to an output 8. Here, by way of example, the charge storage means 17 comprises a capacitor.

The charge storage unit 12 operates in multiple modes: an acquisition mode, a storage mode, or a read mode.

In acquisition mode, the controlled breaker 15 is maintained in the closed position, allowing the signal to pass from the input 6 towards the charge storage means 17. The capacitor of the charge storage means 17 comprises a first plate connected to earth 19 and a second plate connected to the input 6 via the controlled breaker 15. When an analog signal is applied to the input 6, the entire potential difference is again applied between the two plates of the capacitor of the charge storage means 17. A charge then appears on the second plate of the capacitor, according to the amplitude of the analog signal applied to the input 6.

In storage mode, the controlled breaker 15 is positioned in the open position, isolating the input 6 from the charge storage means 17. Thus, the charge present on the second plate of the capacitor of the charge storage means 17 is maintained for as long as the leakage currents of the capacitor so allow.

In read mode, the controlled breaker 15 is positioned in the closed position, re-establishing the continuity between the input 6 and the capacitor of the charge storage means 17. The output 8 is polarized according to a voltage corresponding to the charge present in the capacitor. The output analog signal corresponds to the input signal stored by the capacitor in the course of the acquisition step.

By analogy, and with reference to the three operating modes described above, the storage unit 12 can be considered to be a means for voltage-sampling the incident radio signal. The sampling considered makes it possible here to store a quantity of charge that is related directly to the voltage of the radio signal received at the input of the storage unit. The person skilled in the art will be able to determine the relation between charge and applied voltage.

The first processing stage 7 can comprise more than one unit 12 for storing samples.

Figure 3:
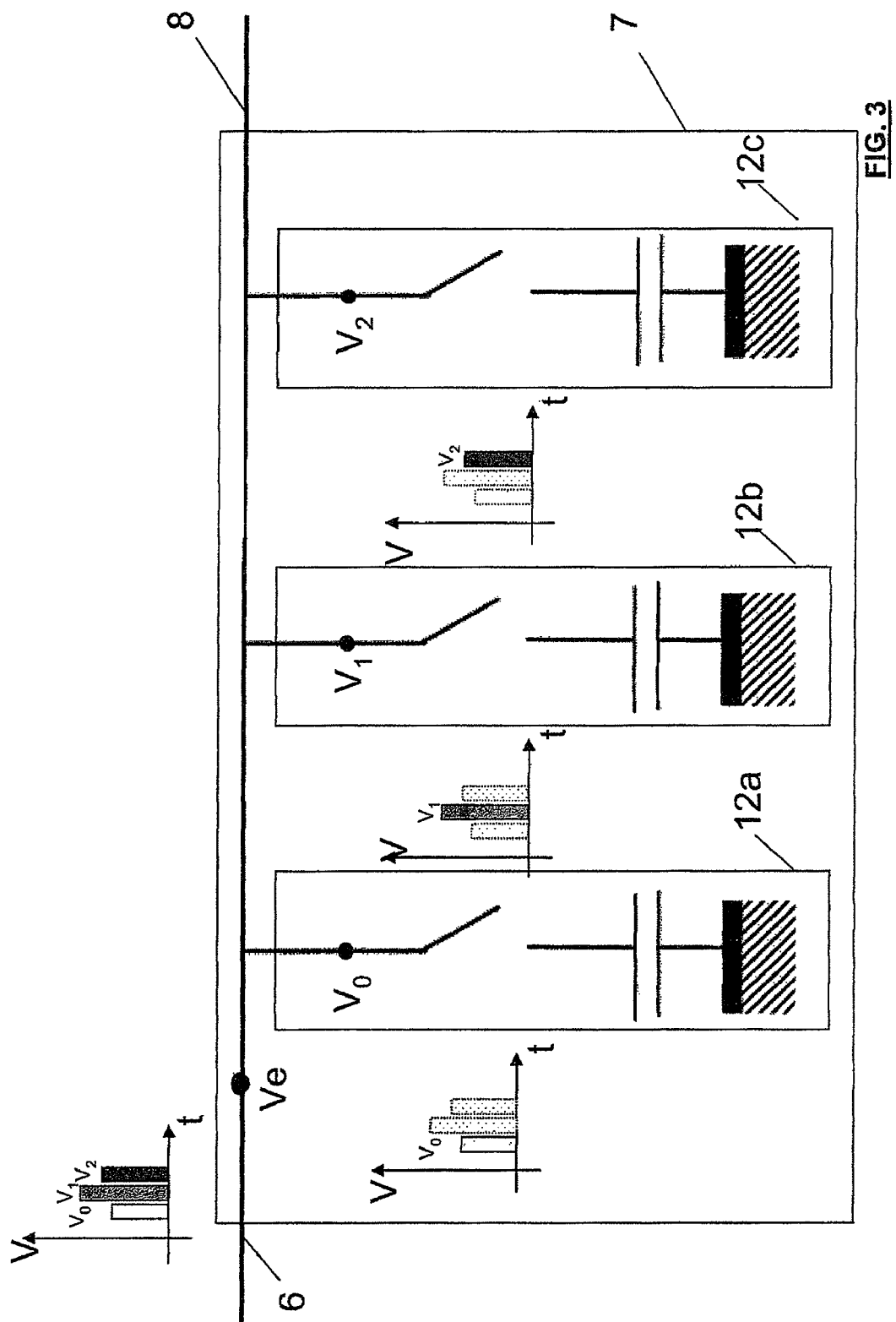
FIG. 3 shows an exemplary association in parallel of three circuits for formulating samples, each circuit operating to store a sample.

FIG. 3 describes in this regard a processing stage 7 comprising three storage units 12 for samples, namely a first storage unit 12a, a second storage unit 12b and a third storage unit 12c. As is seen, the three storage units are joined in parallel. But one would not depart from the scope of the present description were the storage units to be joined in series.

While operational, the processing stage receives, as input, a time-variable analog signal Ve. This signal exhibits, for example, an amplitude equal to $V_0$ at the instant t0, a value $V_1$ at the instant t1 and an amplitude equal to $V_2$ at the instant t2.

At the instant t0, the first storage unit 12a is controlled in such a way as to be positioned in acquisition mode, the other storage units 12b and 12c being controlled so as to be in storage mode. The capacitor of the first storage unit 12a thus stores up, as explained previously, a charge in relationship to the voltage $V_0$.

At the instant t1, the first storage unit 12a is controlled in such a way as to switch to storage mode, so as to preserve the charge stored in its capacitor 17. The second storage unit 12b switches, for its part, to acquisition mode (for storing voltage $V_1$) while the third storage unit 12c remains in storage mode.

The charge stored in the capacitor of the first storage unit is then maintained. Furthermore, the capacitor of the storage means 12b stores up a charge in relationship to the voltage $V_1$.

At the instant t2, the second storage unit 12b switches to storage mode, so as to preserve the charge of the capacitor. The third storage unit is controlled in such a way as to operate in acquisition mode (for storing voltage $V_2$). The first storage unit 12a remains, for its part, in storage mode. The capacitor of the third storage unit 12c stores up a charge in relationship to the voltage $V_2$.

The input analog signal Ve is thus acquired at three distinct instants in the three storage units 12a, 12b and 12c. Subsequently, and following the calculation instructions, any one of the stored samples may be used by toggling the corresponding storage means to read mode.

Stated otherwise, the device comprising the three storage units 12a, 12b and 12c can operate at times as a delay line. The input analog signal Ve is discretely sampled and acquired in the various storage units, making it possible to delay the processing of the various acquired signals ($V_0$ to $V_2$). The delay line thus defined possesses a depth equal to the number of storage units present.

Figure 4:
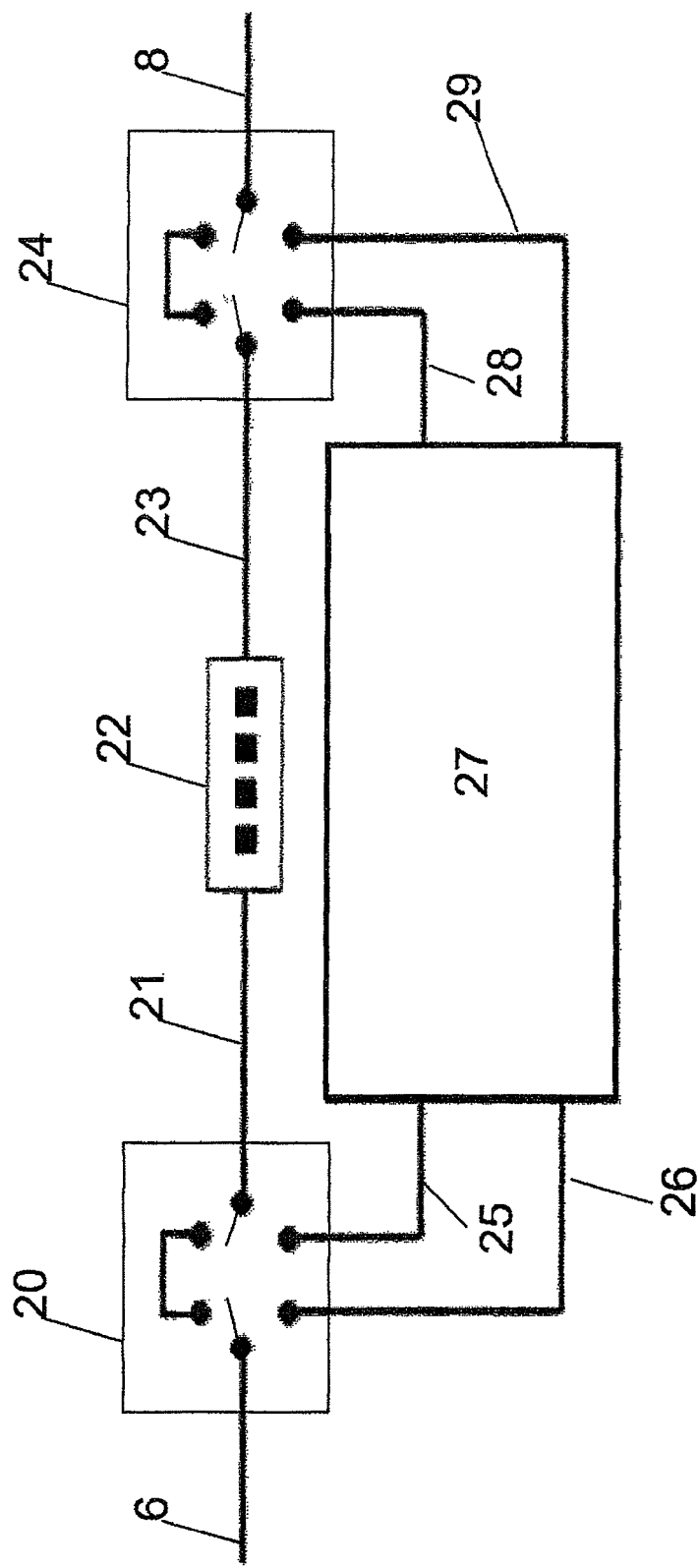
FIG. 4 shows the operating principle of a calculation unit integrated within a calculation loop.

In an embodiment illustrated in FIG. 4, the storage units are inserted into a calculation loop. According to this embodiment, the first processing stage 7 comprises a delay line 22 such as illustrated in FIG. 3, itself comprising storage units 12 such as illustrated in FIG. 2. This embodiment exhibits the advantage of making it possible to reuse each sample successively.

The input 6 is here linked to a first switching device 20 which is linked on the one hand to a delay line 22 by a connection 21 and on the other hand to a (analog processing) calculation unit 27 by an input connection 26 and by an output connection 25. The delay line 22 is linked to a second switching device 24 by a connection 23. The calculation unit 27 is linked to the second switching device 24 by an output link 29 and by an input link 28. The second switching device 24 is finally linked to the output 8.

An input analog signal is received on the input 6. The first switching device 20 steers this signal either towards the calculation unit 27 or towards the delay line 22. The delay line 22 makes it possible to acquire in discrete form the input signal in the form of samples. Each sample can then be processed by the calculation unit 27 or be emitted by the output 8, according to the steering carried out by the second switching device 24.

Such a calculation loop makes it possible to carry out basic arithmetic operations on the input signal, according to the calculation means included in the calculation unit 27.

For a calculation mode taking into account real and complex parts of the signal, the various connections described in this example must be considered to be double, so as to convey real part and imaginary part in a distinct manner.

As appreciated, the processing device which has just been described makes it possible to carry out basic operations on a set of analog samples so as to unburden a signal digital processor of the basic operations.

Moreover, the processing device essentially comprises passive elements. The consumption of the processing device is low given that the switching means and devices represent the elements that are apt to exhibit the greatest power consumption.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A device for processing a radio signal, comprising:
   a circuit configured to form analog voltage samples of the radio signal;
   a circuit configured to perform analog processing on the analog voltage samples;
   an analog-to-digital converter configured to convert the analog processed analog voltage samples to digital samples; and
   a digital signal processor configured to perform digital processing on the digital samples output from the analog-to-digital converter,
   wherein the circuit configured to perform analog processing ensures analog processing of the voltage samples prior to the digital processing.

2. The device according to claim 1, wherein the circuit configured to form voltage samples comprises: a switch configured to sample the radio signal and a charge storage device, disposed at the output of the switch, configured to store at least one sample.

3. The device according to claim 2, wherein the circuit configured to form voltage samples comprises at least one unit configured to store samples that operates to successively acquire on command and in the form of a charge successive samples of an analog input signal, to preserve the charge for a determined duration, and to release on command the charge, the charge being dependent on the amplitude of the analog input signal.

4. The device according to claim 3, in which plural units configured to store samples are associated in series so as to store a number of samples equal to the number of storage units.

5. The device according to claim 3, in which plural units configured to store samples are associated in parallel so as to store a number of samples equal to the number of storage units.

6. The device according to claim 3, in which each unit configured to store samples is inserted into a circuit loop so as to reuse each sample.

7. The device according to claim 1, wherein the circuit configured to form voltage samples comprises:
   a switch having an input receiving the radio signal;
   a charge storage device, disposed at an output of the switch, which stores a voltage sample of the radio signal;
   wherein the switch is set in a first state at a first time instant to collect charge relating to the voltage sample, set in a second state at a subsequent second time instant to store the collected charge, and set in the first state at a subsequent third time instant to output the stored charge.

8. The device according to claim 1, wherein the circuit configured to form voltage samples comprises:
   a first switch having an input receiving the radio signal;
   a first charge storage device, disposed at an output of the first switch, which stores a first voltage sample of the radio signal;
   a second switch having an input receiving the radio signal;
   a second charge storage device, disposed at an output of the second switch, which stores a second voltage sample of the radio signal;
   wherein the first switch is set in a first state at a first time instant to collect charge relating to the first voltage sample, set in a second state at a subsequent second time instant to store the collected charge, and set in the first state at a subsequent third time instant to output the stored charge; and
   wherein the second switch is set in a first state at the second time instant to collect charge relating to the second voltage sample, set in the second state at the subsequent third time instant to store the collected charge, and set in the first state at a subsequent fourth time instant to output the stored charge.

9. The device according to claim 1, wherein the circuit configured to form voltage samples comprises:
   a first switch having an input receiving the radio signal;
   a first charge storage device, disposed at an output of the first switch, which stores a first voltage sample of the radio signal;
   a second switch having an input receiving the radio signal;
   a second charge storage device, disposed at an output of the second switch, which stores a second voltage sample of the radio signal;
   a third switch having an input receiving the radio signal;
   a third charge storage device, disposed at an output of the third switch, which stores a third voltage sample of the radio signal;
   wherein the first switch is set in a first state at a first time instant to collect charge relating to the first voltage sample, and set in a second state at a subsequent second and third time instants to store charge;
   wherein the second switch is set in the first state at the second time instant to collect charge relating to the second voltage sample, and set in the second state at the first and third time instants to store charge;
   wherein the third switch is set in the first state at the third time instant to collect charge relating to the third voltage sample, and set in the second state at the first and second time instants to store charge.

10. The device according to claim 9, wherein the first, second and third switches are individually set in the first state at a subsequent time instant to output the stored charge relating to the first, second and third voltage samples, respectively.

11. The device according to claim 1, wherein the circuit configured to perform analog processing on the analog voltage samples comprises a circuit configured to implement a calculation loop configured to carry out an arithmetic operation on the analog voltage samples.

12. A method for processing a radio signal, comprising:
    voltage-sampling of the radio signal;
    analog processing of the voltage samples;

converting the analog processed voltage samples from the analog domain to the digital domain; and digital processing of the converted analog processed voltage samples.

13. The method for processing a radio signal according to claim 12, where voltage-sampling comprises: acquiring a sample of an analog input signal on command in the form of a charge; preserving the charge for a certain duration; and releasing the charge on command.

14. The method for processing a radio signal according to claim 13, wherein acquiring and releasing of the charge are carried out on command of a switching circuit.

15. The method for processing a radio signal according to claim 13, wherein analog processing of the voltage samples comprises performing elementary arithmetic operations on the voltage samples.

16. The method according to claim 12, wherein the voltage-sampling of the radio signal comprises:
   at a first time instant collecting charge relating to the voltage sample;
   at a subsequent second time instant storing the collected charge;
   at a subsequent third time instant outputting the stored charge.

17. The method according to claim 12, wherein the voltage-sampling of the radio signal comprises:
   at a first time instant collecting charge relating to a first voltage sample in a first storage device;
   at a subsequent second time instant:
   storing the collected charge of the first voltage sample in the first storage device; and
   collecting charge relating to a second voltage sample in a second storage device; and
   at a subsequent third time instant:
   outputting the stored charge of the first voltage sample from the first storage device; and
   storing the collected charge of the second voltage sample in the second storage device.

18. The method according to claim 12, wherein the voltage-sampling of the radio signal comprises:
   at a first time instant:
   collecting charge relating to a first voltage sample in a first storage device; and
   storing previously collected charge of other voltage samples in a second and third storage device;
   at a subsequent second time instant:
   storing collected charge in the first and third storage devices; and
   collecting charge relating to a second voltage sample in the second storage device; and
   at a subsequent third time instant:
   storing collected charge in the first and second storage devices; and
   collecting charge relating to a third voltage sample in the third storage device.

19. The method according to claim 18, further comprising, at subsequent time instants, individually outputting stored charge relating to the first, second and third voltage samples, respectively.

20. The method according to claim 12, wherein analog processing comprises passing the voltage samples through a calculation loop configured to carry out an arithmetic operation on the voltage samples.

21. A device for processing an analog radio-frequency signal, comprising:
   a first circuit configured to take voltage samples of the analog radio-frequency signal;
   a second circuit configured to store the voltage samples of the analog radio-frequency signal in a multi-stage delay line;
   an analog processing circuit configured to perform analog processing on the stored voltage sample output from the multi-stage delay line, said analog processing comprising carrying out an arithmetic operation on the voltage sample;
   an analog-to-digital converter configured to convert an analog signal output from the analog processing circuit to a digital signal; and
   a digital signal processor configured to process the digital signal.

22. The device according to claim 21, wherein the analog processing circuit comprises a circuit configured to implement an analog calculation loop configured to carry out said arithmetic operation on the voltage sample.

23. A method for processing an analog radio-frequency signal, comprising:
   voltage sampling of the analog radio-frequency signal;
   storing the voltage samples of the analog radio-frequency signal in a multi-stage delay line;
   analog processing of the stored voltage sample received from the multi-stage delay line, said analog processing comprising carrying out an arithmetic operation on the voltage sample;
   converting an analog signal output from the analog processing to a digital signal; and
   digital signal processing of the digital signal.

24. The method according to claim 23, wherein analog processing comprises passing the voltage sample through a calculation loop configured to carry out said arithmetic operation on the voltage sample.

* * * * *